(12) United States Patent
Pang

(10) Patent No.: US 9,043,187 B2
(45) Date of Patent: May 26, 2015

(54) METHOD OF MATERIAL MODELING FOR CRASH TEST DUMMY FINITE ELEMENT MODELS

(75) Inventor: Hyunsok Pang, Rochester Hills, MI (US)

(73) Assignee: HUMANETICS INNOVATIVE SOLUTIONS, INC., Plymouth, MI (US)

( * ) Notice: Subject to any disclaimer, the term of this patent is extended or adjusted under 35 U.S.C. 154(b) by 498 days.

(21) Appl. No.: 13/333,313

(22) Filed: Dec. 21, 2011

(65) Prior Publication Data

US 2012/0173213 A1 Jul. 5, 2012

Related U.S. Application Data

(60) Provisional application No. 61/428,577, filed on Dec. 30, 2010.

(51) Int. Cl.
*G06F 17/10* (2006.01)
*G06F 17/50* (2006.01)

(52) U.S. Cl.
CPC ........ *G06F 17/5018* (2013.01); *G06F 17/5095* (2013.01)

(58) Field of Classification Search
None
See application file for complete search history.

(56) References Cited

U.S. PATENT DOCUMENTS

| | | |
|---|---|---|
| 6,982,409 B2 | 1/2006 | Huang et al. |
| 7,086,273 B2 | 8/2006 | Lipmyer |
| RE42,418 E | 6/2011 | Lipmyer |
| 8,086,430 B2 | 12/2011 | Thomas |
| 8,407,033 B2 | 3/2013 | Cooper et al. |

OTHER PUBLICATIONS

Arnoux et al., "Radioss Finite Element Model of the Thor Dummy", International Journal of Crashworthiness, vol. 8, Issue 6, 2003, pp. 529-541.*
Peng et al., "Stored energy function and compressibility of compressible rubberlike materials under large strain", Journal of Applied Physics, vol. 46, No. 6, Jun. 1975, pp. 2599-2604.*
Eskandarian et al., "Finite element model and validation of a surrogate crash test vehicle for impacts with roadside objects", http://ntl.bts.gov/data/letter_am/bogie_paper.pdf, 1997, 19 pages.*
Du Bois et al., "Crashworthiness analysis of structures made from polymers", LS-DYNA Anwenderforum, 2004, 12 pages.*
Kolling et al., "A tabulated formulation of hyperelasticity with rate effects and damage", Computational Mechanics, vol. 40, Issue 5, Oct. 2007, pp. 885-899.*

* cited by examiner

*Primary Examiner* — Omar Fernandez Rivas
*Assistant Examiner* — Herng-Der Day
(74) *Attorney, Agent, or Firm* — Howard & Howard Attorneys PLLC

(57) ABSTRACT

A computer method of material modeling for crash test dummy finite element models includes the steps of making a material card for the material, applying the material card to validate a finite element model of a crash test dummy component, determining whether the finite element model is acceptable, ending the method if the finite element model is acceptable, and adjusting a relative volume (J) range for the material to make the material soft or stiff if the finite element model is not acceptable.

14 Claims, 9 Drawing Sheets

QUASI-STATIC STRESS STRAIN TEST CURVE

METHOD OF MATERIAL MODELING FOR CRASH TEST DUMMY FINITE ELEMENT MODELS

CROSS-REFERENCE TO RELATED APPLICATION(S)

The present application claims the priority date of U.S. Provisional Patent Application Ser. No. 61/428,577, filed Dec. 30, 2010.

BACKGROUND OF THE INVENTION

1. Field of the Invention

The present invention relates generally to finite element models for crash test dummies and, more particularly, to a method of material modeling for crash test dummy finite element models.

2. Description of the Related Art

Automotive, aviation, and other vehicle manufacturers conduct a wide variety of collision testing to measure the effects of a collision on a vehicle and its occupants. Through collision testing, a vehicle manufacturer gains valuable information that can be used to improve the vehicle.

Collision testing often involves the use of anthropomorphic mannequins, better known as "crash test dummies." During collision testing, an operator places a crash test dummy inside a vehicle, and the vehicle undergoes a simulated collision. The collision exposes the crash test dummy to high inertial loading, and sensors inside the crash test dummy, such as accelerometers, pressure gauges, and the like, generate electrical signals of data corresponding to the loading. Cables transmit these electrical signals of data to a data acquisition system (DAS) for subsequent processing. This data reveals information about the effects of the collision on the crash test dummy and can be correlated to the effects a similar collision would have on a human occupant.

In any commercially available crash simulation softwares such as LS-DYNA, PAM-CRASH, and ABAQUS, users cannot handle J (relative volume). In these softwares, to make the material stiff or soft, the user scales up or down the stress-strain test curve, which disturbs the original test curve and is not efficient. In addition, the maximum number of parameters from these softwares is 3 or 4, which results in poor curve fitting because these softwares do not use Genetic Algorithm.

SUMMARY OF THE INVENTION

Accordingly, the present invention is a computer method of material modeling for crash test dummy finite element models. The method includes the steps of making a material card for the material and applying the material card to validate a finite element model of a crash test dummy component. The method also includes the steps of determining whether the finite element model is acceptable, ending the method if the finite element model is acceptable, and adjusting a relative volume (J) range for the material to make the material soft or stiff if the finite element model is not acceptable.

One advantage of the present invention is that a new computer method of material modeling is provided for crash test dummy finite element models. Another advantage of the present invention is that the method includes adjusting a relative volume (J) range for the material to make the material soft or stiff for a finite element model to be acceptable. Yet another advantage of the present invention is that the method solves both constrained and unconstrained optimization problems. Still another advantage of the present invention is that the method evaluates an objective function directly by putting in parameter values. A further advantage of the present invention is that the method solves highly nonlinear optimization problems. Yet a further advantage of the present invention is that the method solves optimization problems having a large number of parameters. Still a further advantage of the present invention is that method provides curve fitting of constitutive equations, resulting in large time savings and better qualities to users in model validations.

Other features and advantages of the present invention will be readily appreciated, as the same becomes better understood, after reading the subsequent description taken in conjunction with the accompanying drawings.

DESCRIPTION OF THE PREFERRED EMBODIMENT(S)

Figure 1:
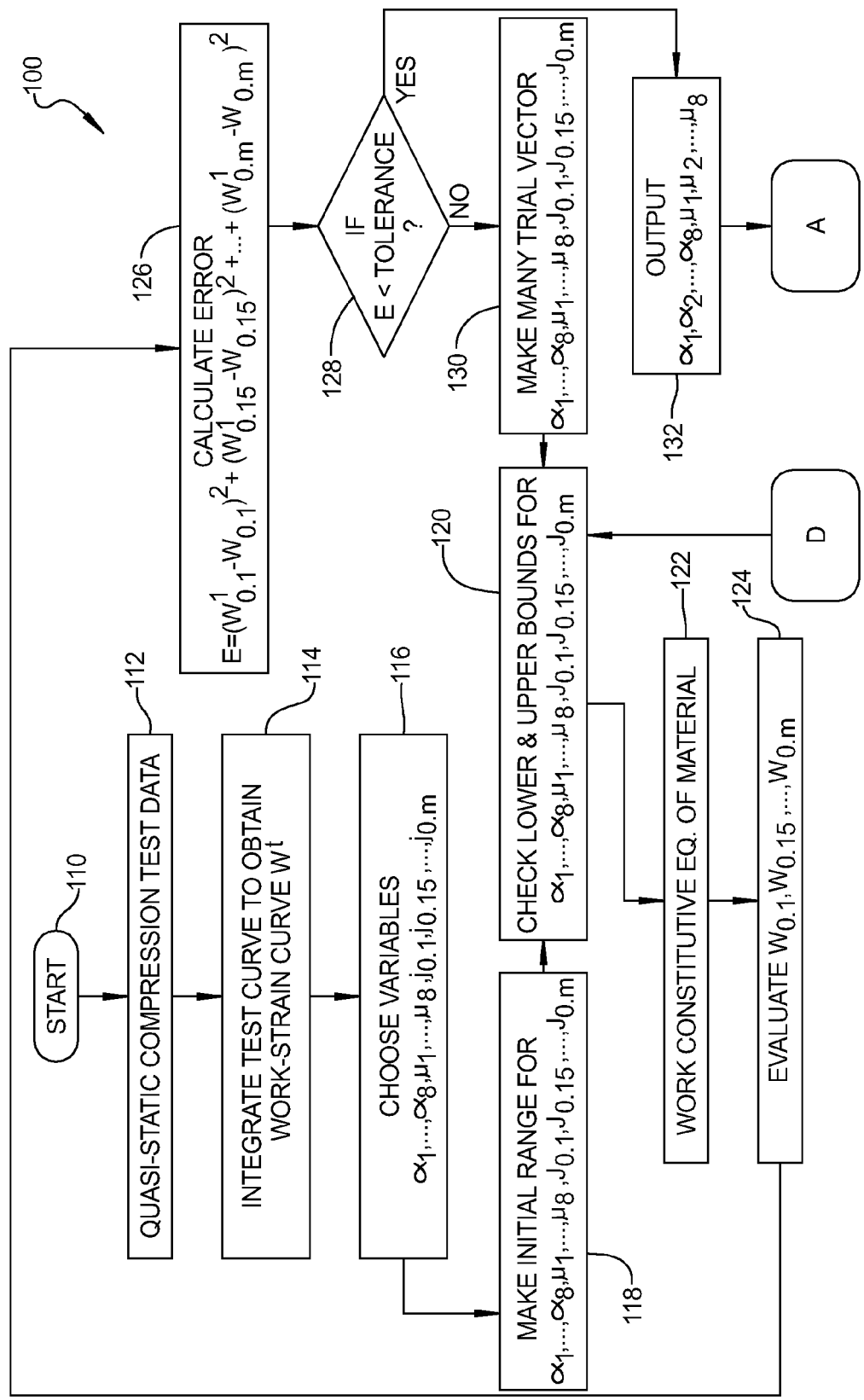
FIGS. 1 through 4 are a flowchart of one embodiment of a method, according to the present invention, of material modeling for crash test dummy finite element models.

Referring to the drawings and in particular FIGS. 1 through 4, one embodiment of a method, according to the present invention, is shown at 100 for material modeling for a crash test dummy (not shown). The method is to be carried out on a computer system that includes a computer having a memory, a processor, a display and user input mechanism, such as a mouse or keyboard (not shown). The method is implemented on the computer system in MATLAB, which is commercially available from MathWorks, coupled with other lower level languages. Efficient numerical algorithms (Genetic Algorithm) are used and coded, making it possible that a complete analysis can be done within minutes on a Pentium computer of the computer system. It should be appreciated that the computer system is conventional and known in the art.

Figure 5:
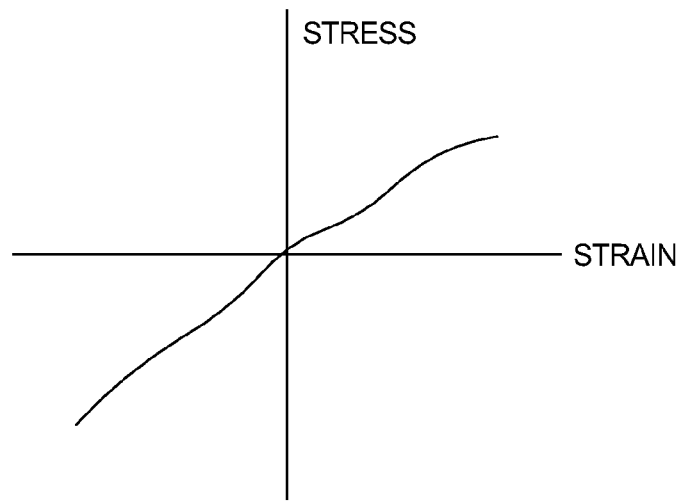
FIG. 5 is a quasi-static stress strain test curve from the material to be used in the method of FIGS. 1 through 4.
Figure 7:
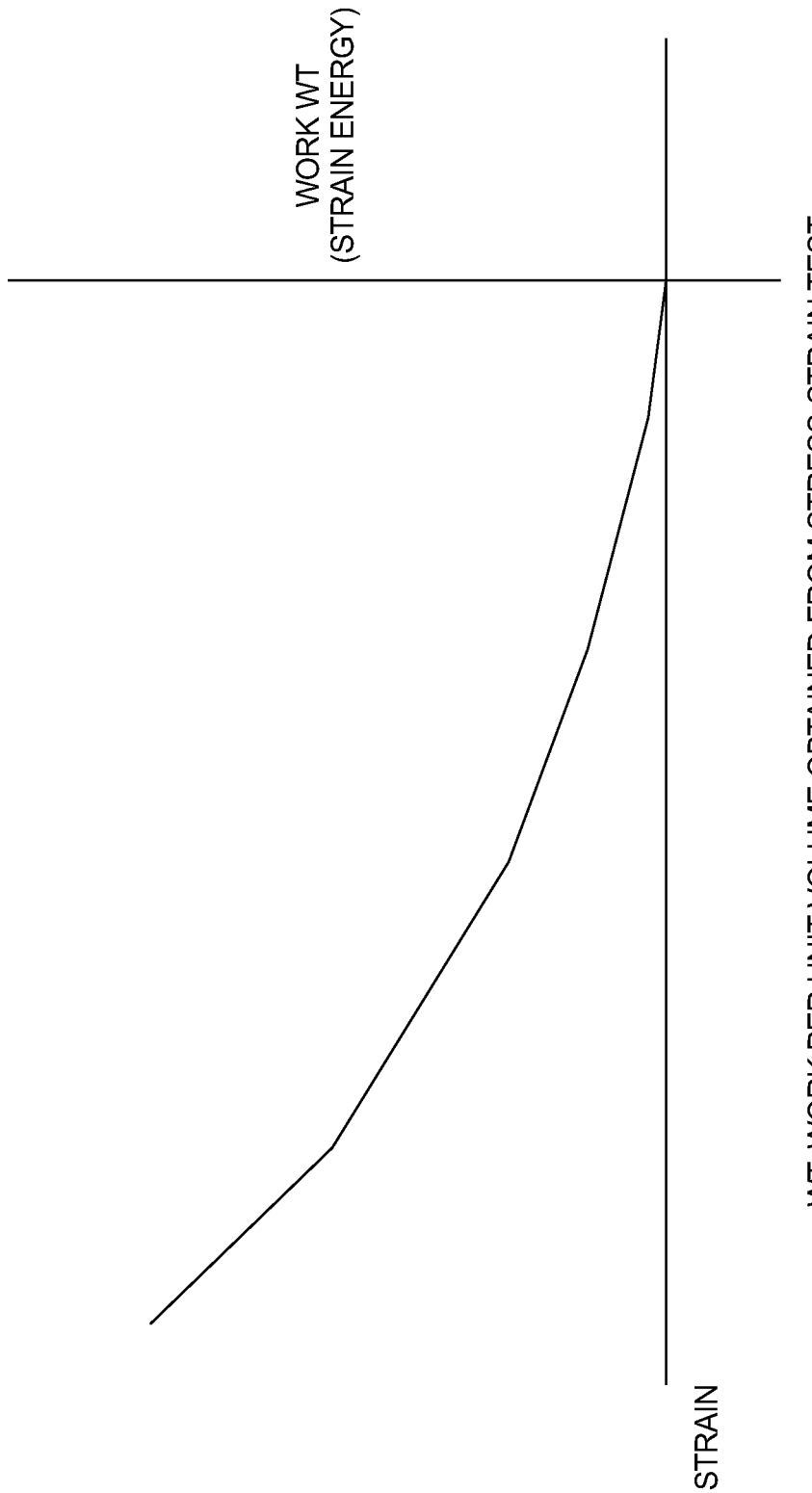
FIG. 7 is a work curve by integrating the stress-strain test curve being curve fitted using the method of FIGS. 1 through 4.

Referring to FIG. 1, the method starts in bubble 110 and advances to block 112. In block 112, the method inputs quasi-static compression test data for the material to be modeled such as rubber. For example, the method obtains test data from a quasi-static stress strain test curve (tension or compression) for the material as illustrated in FIG. 5. The method then advances to block 114 and integrates a test curve for the material to obtain a work-strain curve $W^t$. For example, the method obtains a work (per unit volume) curve by integrating a quasi-static stress strain test curve for the material as illustrated in FIG. 7. The method then advances to block 116 and chooses predetermined variables such as $\alpha_1, \ldots, \alpha_s$, $\mu_1, \ldots, \mu_s, J_{0.1}, J_{0.15}, \ldots, J_{0.m}$. The method advances to block 118 and makes an initial range for the variables $\alpha_1, \ldots, \alpha_s$, $\mu_1, \ldots, \mu_s, J_{0.1}, J_{0.15}, \ldots, J_{0.m}$ based on engineering judgment. The method then advances to block 120 and checks lower and upper bounds for the variables $\alpha_1, \ldots, \alpha_s, \mu_1, \ldots, \mu_s, J_{0.1}, J_{0.15}, \ldots, J_{0.m}$ against predetermined values. The method advances to block 122 and calculates the Strain Work using Constitutive Equations of the material as follows:

Strain Energy Functional $$W^* = \sum_{i=1}^{3}\sum_{j=1}^{n} \frac{\mu_j}{\alpha_j}(\lambda_i^{*\alpha_j} - 1) + \frac{K}{2}(1-J)^2$$

$\mu_j$: parameters to be determined through curvefitting
$\alpha_j$: parameters to be determined through curvefitting
n: number of terms, up to 8
$\lambda^*_i$: principal stretches that volumetric effects have been eliminated
K: bulk modulus to be determined within acceptable range through curve fitting
J: relative volume to be determined within controlled range through curve fitting Stress Relaxation by a Convolution Integral Form $$\sigma_{ij} = \int_0^t g_{ijkl}(t-\tau)\frac{\partial \varepsilon_{kl}}{\partial \tau}d\tau$$

Prony Series in Shear Relaxation
$g_{ijkl}(t-\tau)$: relaxation function for stress measure $$g(t) = \sum_{i=1}^{N} G_i e^{-\beta_i t}$$

$G_i$: shear moduli (to be determined through curve fitting)
$\beta_i$: decay constant (to be determined through curve fitting)
N: up to 6 terms The method then advances to block 124 and evaluates the work (W) for $W_{0.1}, W_{0.15}, \ldots, W_{0.m}$ according to the equation as follows:

$$W^* = \sum_{i=1}^{3}\sum_{j=1}^{n} \frac{\mu_j}{\alpha_j}(\lambda_i^{*\alpha_j} - 1) + \frac{K}{2}(1-J)^2$$

Uniaxial Test Principal Stretches $$\lambda_1 = L/L_0 = 1 + \varepsilon_1$$

Relative Volume $$J = \lambda_1\lambda_2\lambda_3 = \frac{V}{V_0} \quad \lambda_2 = \lambda_3 = \sqrt{\frac{J}{\lambda_1}}$$

Principal Stretches that Volumetric Effects have been eliminated $$\lambda^*_i = J^{-1/3}\lambda_i$$

Work from test=Work from strain energy functional $$WT \approx W^* = \frac{\mu_1}{\alpha_1}(\lambda_1^{*\alpha_1} - 1) + \frac{\mu_2}{\alpha_2}(\lambda_1^{*\alpha_2} - 1) + \ldots + \frac{\mu_n}{\alpha_n}(\lambda_1^{*\alpha_n} - 1) +$$
$$\frac{\mu_1}{\alpha_1}(\lambda_2^{*\alpha_1} - 1) + \frac{\mu_2}{\alpha_2}(\lambda_2^{*\alpha_2} - 1) + \ldots + \frac{\mu_n}{\alpha_n}(\lambda_1^{*\alpha_n} - 1) +$$
$$\frac{\mu_1}{\alpha_1}(\lambda_3^{*\alpha_1} - 1) + \frac{\mu_2}{\alpha_2}(\lambda_3^{*\alpha_2} - 1) + \ldots + \frac{\mu_n}{\alpha_n}(\lambda_3^{*\alpha_n} - 1) + \frac{K}{2}(1-J)^2$$

The method then advances to block 126 and calculates or minimizes the work error (E), which is an objective function, according to the following equation:

$$\text{Error} = (WT_0 - W^*_0)^2 + (WT_{0.1} - W^*_{0.1})^2 + (WT_{0.2} - W^*_{0.2})^2 + \ldots + (WT_{0.m} - W^*_{0.m})^2$$

with the parameters to be determined:

$\mu_1, \mu_2, \ldots, \mu_n, \alpha_1, \alpha_2, \ldots, \alpha_n, J_{0.1}, J_{0.2}, \ldots, J_{0.m}, K$
where the maximum n is 8.

Figure 8:
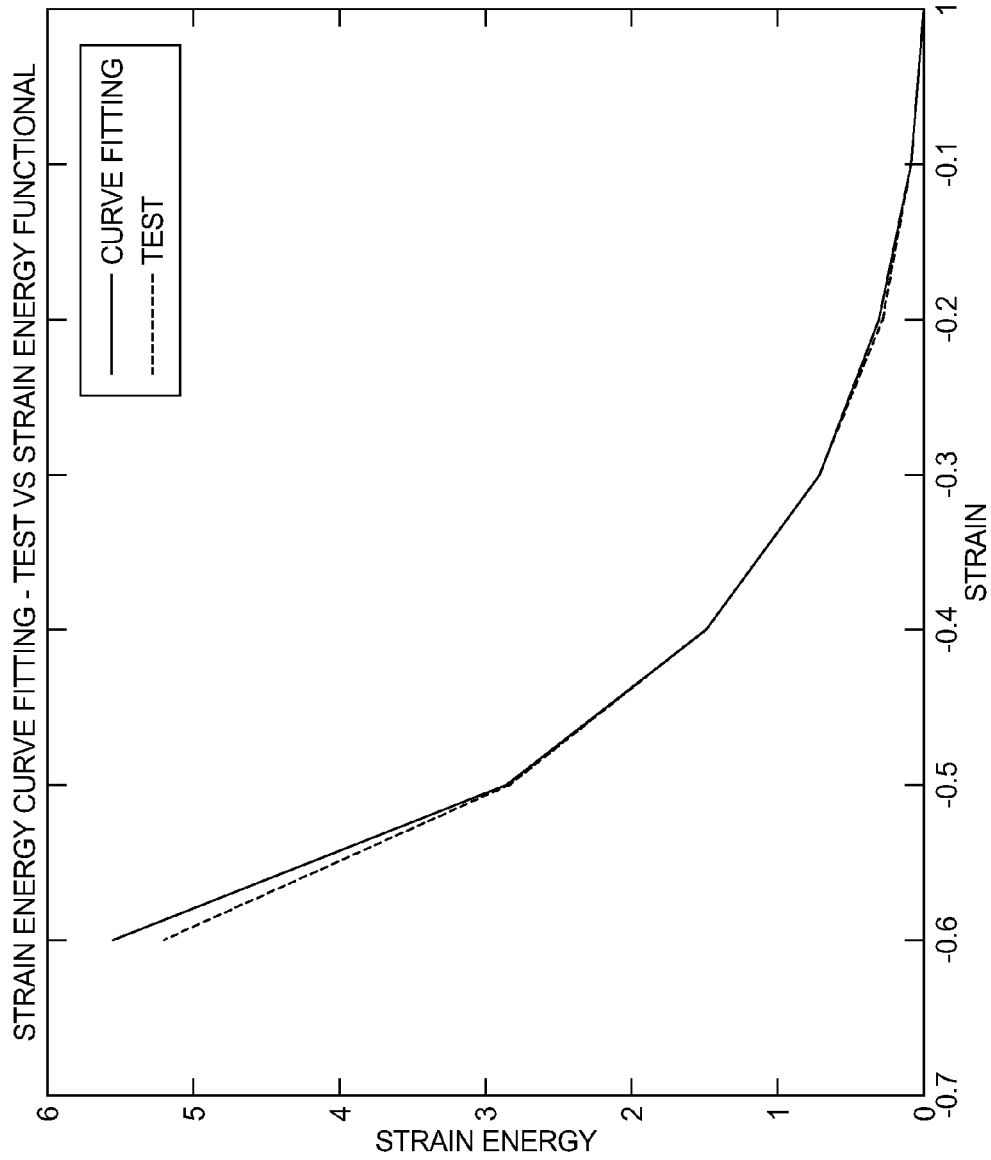
FIG. 8 is a strain energy curve fitting for the material to be modeled using the method of FIGS. 1 through 4.

The method then advances to diamond 128 and determines whether the work error (E) is less than a predetermined tolerance. If not, the method advances to block 130 and makes many trial vectors using MATLAB Genetic Algorithm by performing strain energy curve fitting as illustrate in FIG. 8. The method then advances to block 120 previously described.

If the work error is less than the predetermined tolerance in diamond 128, the method advances to block 132 and outputs the variables $\alpha_1, \ldots, \alpha_s, \mu_1, \ldots, \mu_s, J_{0.1}, J_{0.15}, \ldots, J_{0.m}$. The method then advances through bubble A to block 158 of FIG. 3 to be described.

Figure 2:
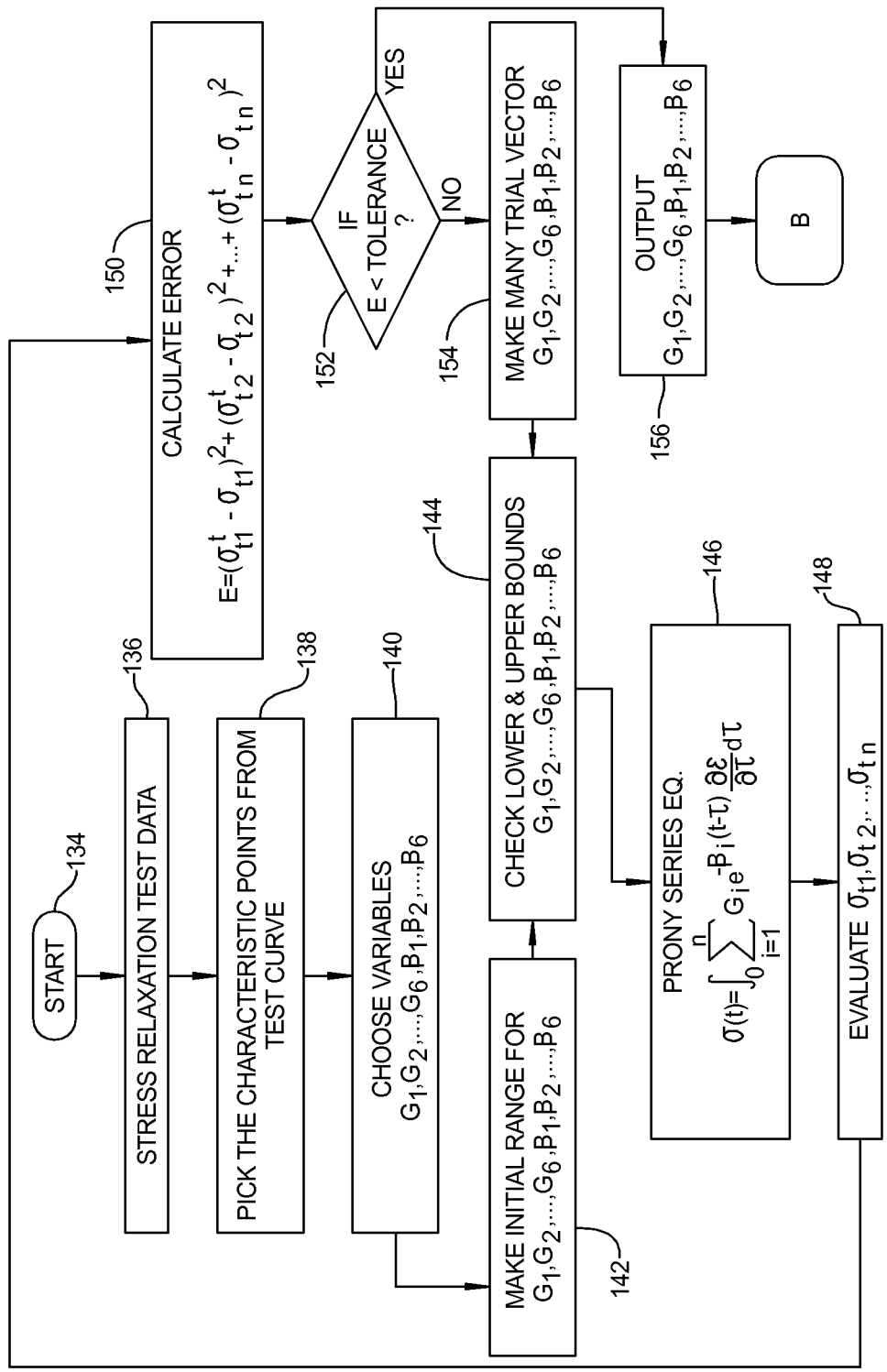
Figure 6:
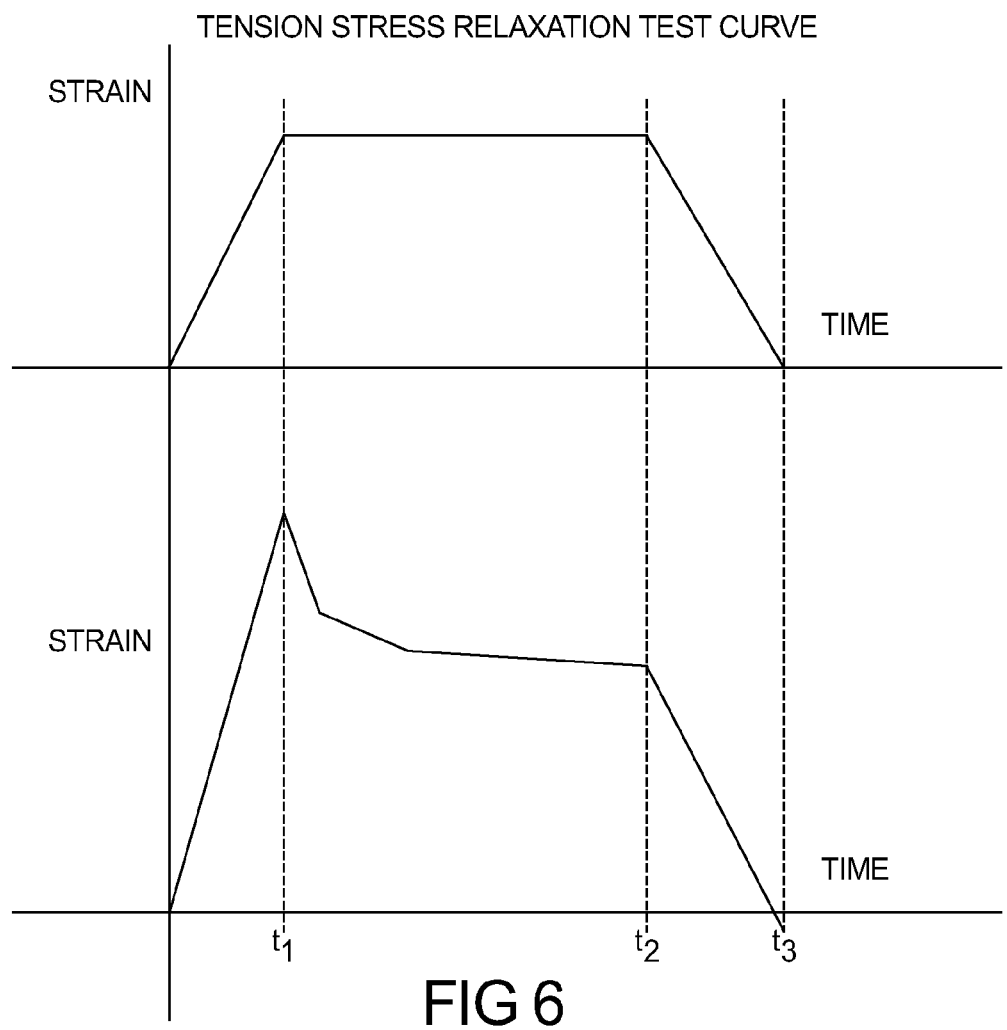
FIG. 6 is a tension stress relaxation test curve from the material to be used in the method of FIGS. 1 through 4.
Figure 9:
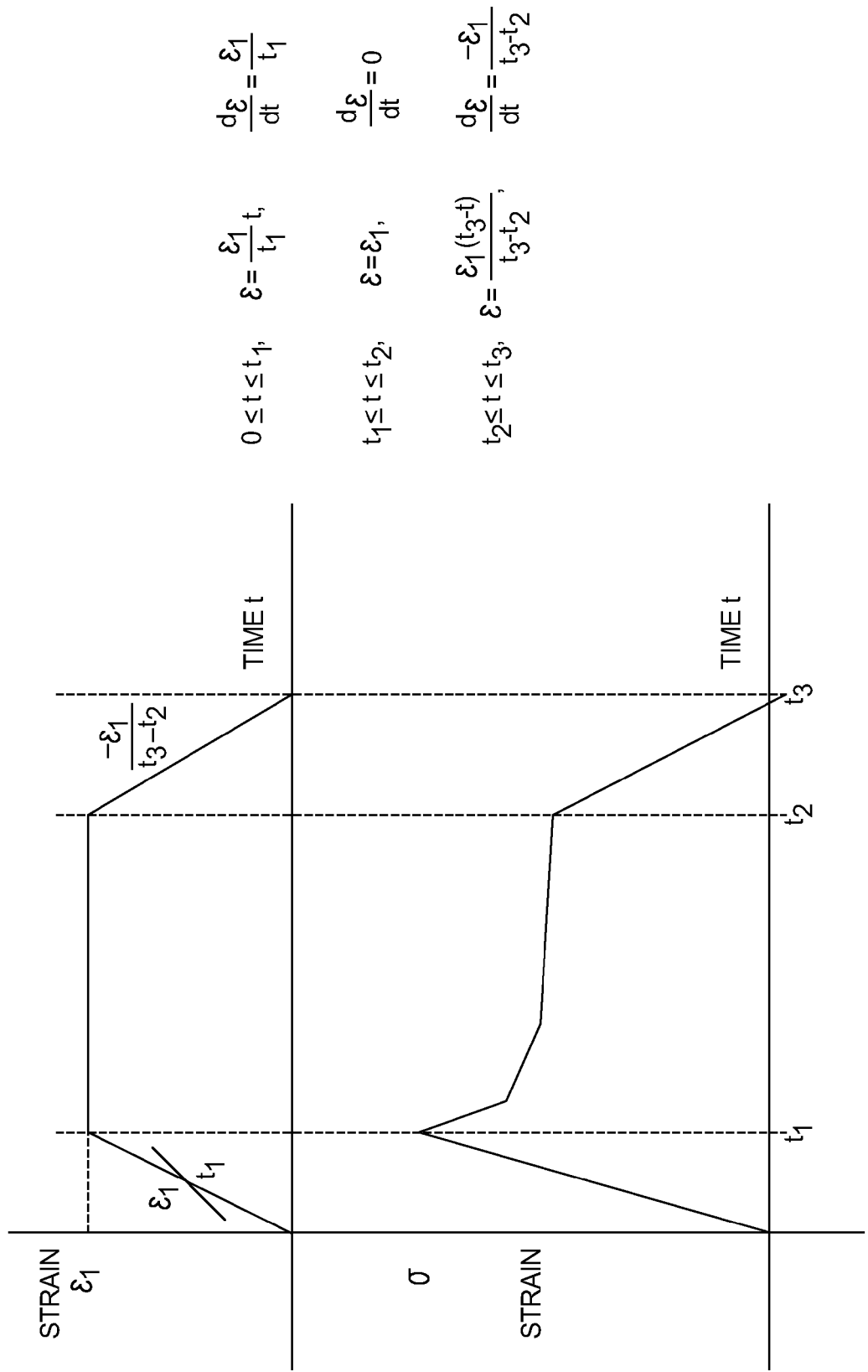
FIG. 9 is a stress relaxation test curve and strain curve for the material being curve-fitted using the method of FIGS. 1 through 4.

Referring to FIG. 2 the method also starts in bubble 134 and advances to block 136. In block 136, the method inputs the stress relaxation data. For example, the method obtains data from a tension stress relaxation test curve for the material as illustrated in FIG. 6. The method then advances to block 138 and picks characteristic points from the test curve. For example, the method obtains stress at time t from the stress relaxation test curve and calculates strain rate at time t from the strain curve as illustrated in FIG. 9. The method then advances to block 140 and chooses predetermined variables as follows:

$G_1, G_2, \ldots, G_n, \beta_1, \beta_2, \ldots, \beta_n$

The method advances to block 142 and makes the initial range for the variables $G_1, G_2, \ldots, G_n, \beta_1, \beta_2, \ldots, \beta_n$ based on testing and engineering judgment. The method advances to block 144 and checks lower and upper bounds for the variables $G_1, G_2, \ldots, G_n, \beta_1, \beta_2, \ldots, \beta_n$ against predetermined values. The method advances to block 146 and calculates the stress relaxation test curve using Prony Series Equations as follows:

$$\sigma_P(t) = \int_0^t \sum_{i=1}^{n} G_i e^{-\beta_i(t-\tau)} \frac{\partial \varepsilon}{\partial \tau} d\tau$$

$$0 \leq t \leq t_1$$

$$\sigma(t) \approx \sigma_P(t) = \int_0^t \sum_{i=1}^{n} G_i e^{-\beta_i(t-\tau)} \frac{\varepsilon_1}{t_1} d\tau$$

$$t_1 \leq t \leq t_2$$

-continued $$\sigma(t) \approx \sigma_P(t)$$

$$= \int_0^{t_1} \sum_{i=1}^n G_i e^{-\beta_i(t-\tau)} \frac{\varepsilon_1}{t_1} d\tau + \int_{t_1}^t \sum_{i=1}^n G_i e^{-\beta_i(t-\tau)} \times 0 d\tau$$

$$= \int_0^{t_1} \sum_{i=1}^n G_i e^{-\beta_i(t-\tau)} \frac{\varepsilon_1}{t_1} d\tau$$

$$t_2 \leq t \leq t_3$$

$$\sigma(t) \approx \sigma_P(t)$$

$$= \int_0^{t_1} \sum_{i=1}^n G_i e^{-\beta_i(t-\tau)} \frac{\varepsilon_1}{t_1} d\tau + \int_{t_1}^{t_2} \sum_{i=1}^n G_i e^{-\beta_i(t-\tau)} \times$$

$$0 d\tau + \int_{t_2}^t \sum_{i=1}^n G_i e^{-\beta_i(t-\tau)} \frac{-\varepsilon_1}{t_3 - t_2} d\tau$$

$$= \int_0^{t_1} \sum_{i=1}^n G_i e^{-\beta_i(t-\tau)} \frac{\varepsilon_1}{t_1} d\tau + \int_{t_2}^t \sum_{i=1}^n G_i e^{-\beta_i(t-\tau)}$$

$$\frac{-\varepsilon_1}{t_3 - t_2} d\tau$$

The method then advances to block 148 and evaluates the stress σ which is obtained in block 146 against test stress. The method advances to block 150 and minimizes the sum of stress errors (objective equation) at the several characteristic points over the time range between the stress test curve and the Prony series equations and calculates the error (E) as follows:

$$\text{Error} = (\sigma_0 - \sigma_{P_0})^2 + (\sigma_1 - \sigma_{P_1})^2 + (\sigma_2 - \sigma_{P_2})^2 + \ldots + (\sigma_n - \sigma_{P_n})^2$$

with the parameters to be determined:
$G_1, G_2, \ldots, G_n, \beta_1, \beta_2, \ldots, \beta_n$
where the maximum n is 6.

Figure 10:
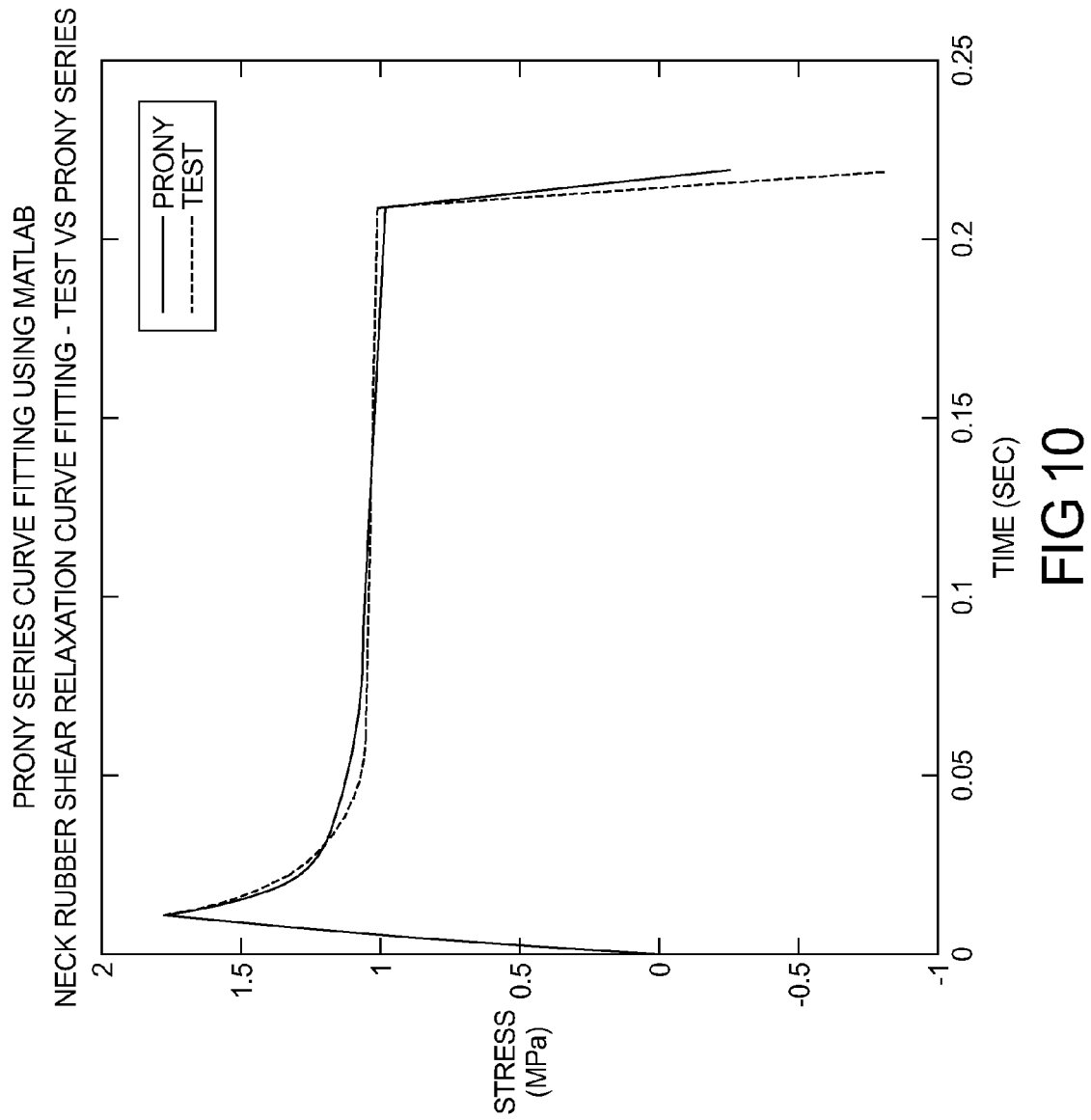
FIG. 10 is a Prony series curve fitting (stress relaxation test) for the material using the method of FIGS. 1 through 4.

The method then advances to diamond 152 and determines whether the error (E) is less than a predetermined tolerance. If not, the method advances to block 154 and makes many trial vectors using MATLAB Genetic Algorithm by performing Prony series curve fitting as illustrate in FIG. 10. The method then advances to block 144 previously described.

If the error is less that the predetermined tolerance in diamond 152, the method advances to block 156 and outputs the parameters $G_1, G_2, \ldots, G_n, \beta_1, \beta_2, \ldots, \beta_n$. The method then advances through bubble B to block 158 of FIG. 3.

Figure 3:
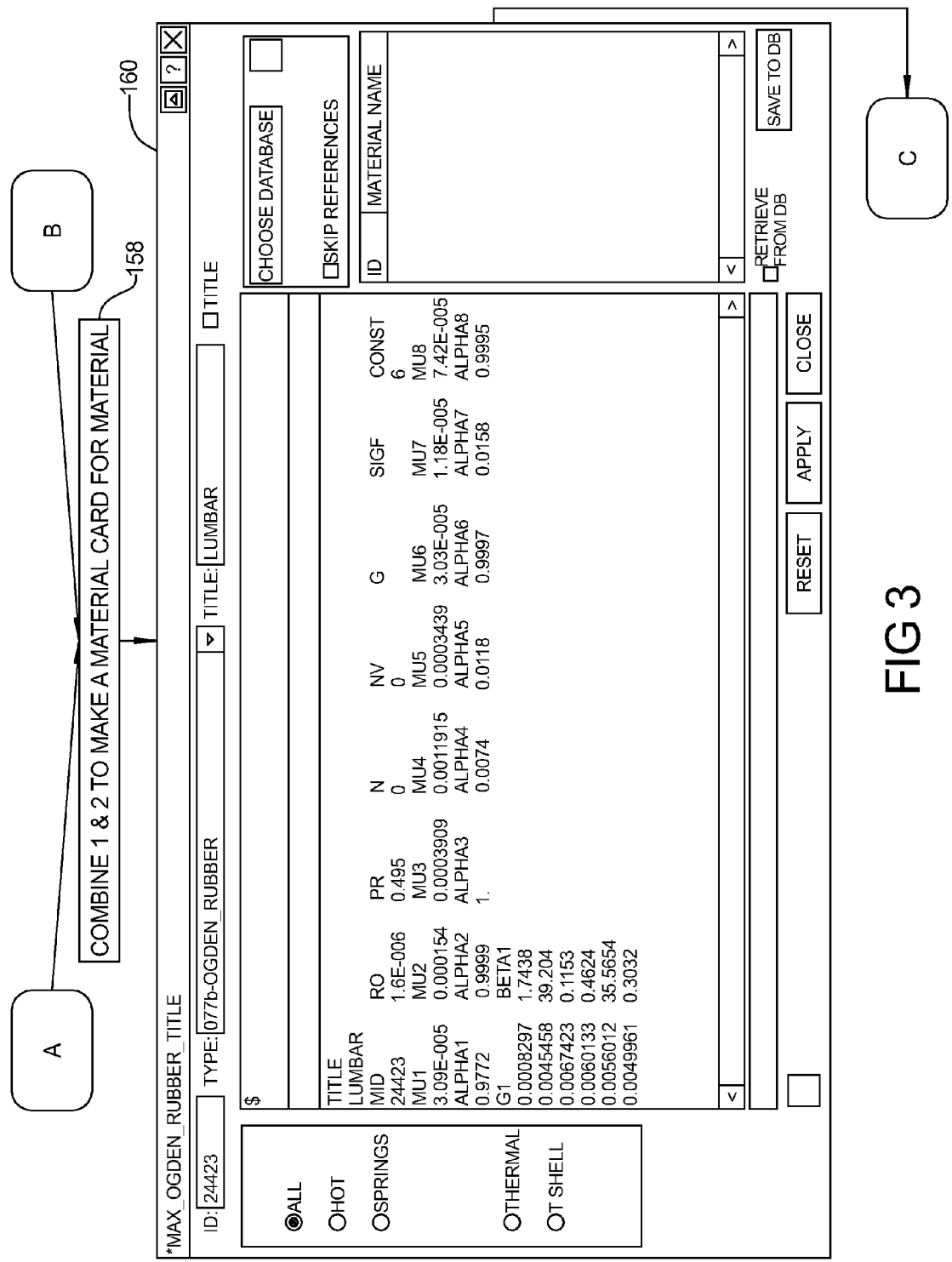

Referring to FIG. 3, the method advances through bubbles A and B to block 158 and creates or makes a material card for the material. The method advances to block 160 and combines the outputs from blocks 132 and 156 to make a material card. The method then advances through bubble C to block 162 of FIG. 4.

Figure 4:
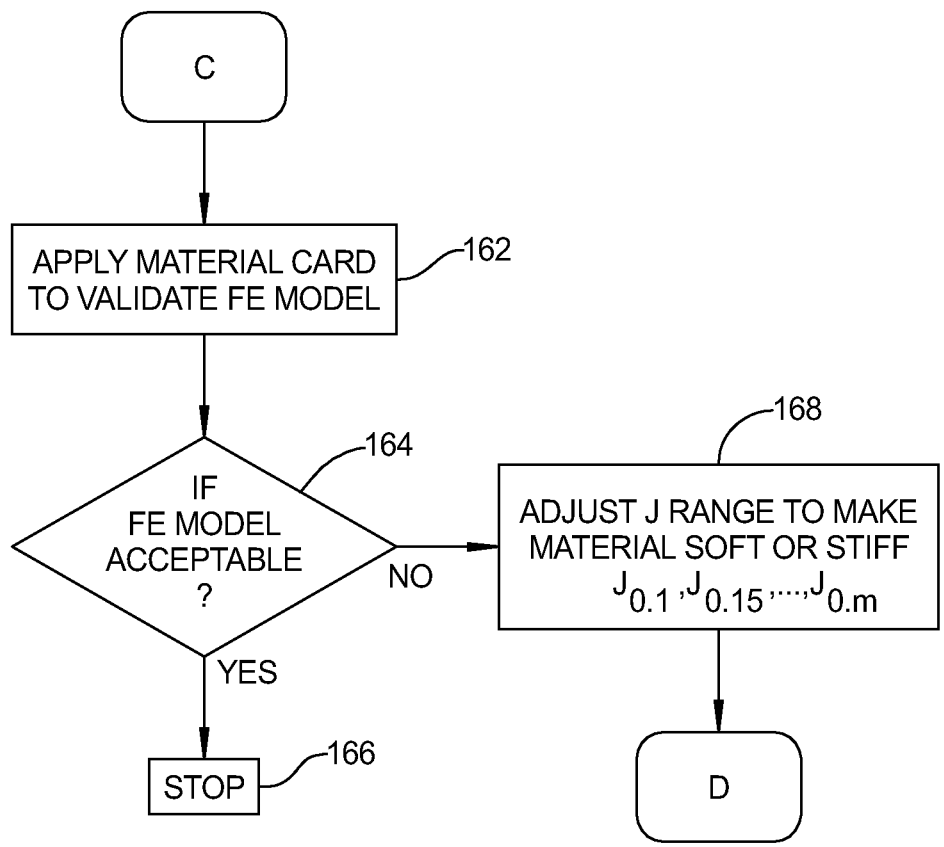

Referring to FIG. 4, the method advances to block 162 and applies the material card to validate a finite element (FE) model for the material. For example, for a drop test, the method applies the material card for the skin material of the head of the crash test dummy in the finite element model and measures acceleration to see if the material produces a desired acceleration. The method then advances to diamond 164 and determines whether the finite element model is acceptable. If so, the method advances to block 166 and stops or ends. If the finite element model is not acceptable in diamond 164, the method advances to block 168 and adjusts the relative volume (J) range to make material soft or stiff. The method then advances to block 120 in FIG. 1 previously described. It should be appreciated that the method continues until the finite element model is acceptable in FIG. 4. It should be appreciated that, in the above example for the skin material, the finite element model is acceptable when the material produces the desired acceleration by having the appropriate softness or stiffness.

The present invention has been described in an illustrative manner. It is to be understood that the terminology, which has been used, is intended to be in the nature of words of description rather than of limitation.

Many modifications and variations of the present invention are possible in light of the above teachings. Therefore, the present invention may be practiced other than as specifically described.

What is claimed is:

1. A computer method of material modeling for crash test dummy finite element models, said method comprising the steps of:
   providing a computer;
   making an initial range for a relative volume (J) for a material of a crash test dummy component using the computer;
   checking lower and upper bounds of the initial range for the relative volume (J) against predetermined values using the computer;
   calculating a strain work of the material based on the relative volume (J) using the computer;
   evaluating the strain work based on the relative volume (J) using the computer;
   calculating a work error of the strain work based on the relative volume (J) using the computer;
   determining whether the work error is less than a first predetermined tolerance using the computer;
   outputting the relative volume (J) if the work error is less than the first predetermined tolerance using the computer;
   making a material card for the material of the crash test dummy component with the outputted relative volume (J) using the computer;
   providing a finite element model for the crash test dummy component using the computer;
   applying the material card in the finite element model to validate the finite element model using the computer;
   determining whether the finite element model is acceptable;
   ending the method if the finite element model is acceptable; and
   adjusting a value for the relative volume (J) for the material card to make the material soft or stiff if the finite element model is not acceptable.

2. The computer method as set forth in claim 1 including the step of inputting quasi-static compression test data for the material to be modeled.

3. The computer method as set forth in claim 2 including the step of integrating a test curve for the material to obtain a work-strain curve.

4. The computer method as set forth in claim 3 including the step of choosing predetermined variables, making an initial range for the variables, and checking lower and upper bounds for the variables.

5. The computer method as set forth in claim 4 including the step of outputting the predetermined variables if the work error is less than the first predetermined tolerance.

6. The computer method as set forth in claim 1 including the step of making multiple trial vectors if the work error is not less than the first predetermined tolerance.

7. The computer method as set forth in claim 1 including the step of inputting stress relaxation test data of the material, calculating a stress relaxation test curve, and picking characteristic points from the stress relaxation test curve.

8. The computer method as set forth in claim 7 including the step of choosing predetermined variables, making an initial range for the variables, and checking lower and upper bounds for the variables.

9. The computer method as set forth in claim 8 including the step of evaluating a stress of the material against test stress of the material.

10. The computer method as set forth in claim 9 including the step of calculating a stress error of the material.

11. The computer method as set forth in claim 10 including the step of determining whether the stress error is less than a predetermined tolerance.

12. The computer method as set forth in claim 11 including the step of outputting the predetermined variables if the stress error is less than the predetermined tolerance.

13. The computer method as set forth in claim 11 including the step of making multiple trial vectors if the stress error is not less than the predetermined tolerance.

14. A computer method of material modeling for crash test dummy finite element models, said method comprising the steps of:

provinding a computer;

inputting quasi-static compression test data for a material of a crash test dummy component to be modeled using the computer;

integrating a test curve for the material to obtain a work-strain curve;

choosing first predetermined variables including a relative volume (J) for the material, making an initial range for the first predetermined variables, and checking lower and upper bounds for the first predetermined variables using the computer;

calculating a strain work of the material based on the first predetermined variables using the computer;

evaluating the strain work based on the first predetermined variables using the computer;

calculating a work error of the strain work based on the first predetermined variables using the computer;

determining whether the work error is less than a first predetermined tolerance using the computer;

outputting the first predetermined variables if the work error is less than the first predetermined tolerance using the computer;

making multiple trial vectors if the work error is not less than the first predetermined tolerance using the computer;

inputting stress relaxation test data of the material, calculating a stress relaxation test curve, and picking characteristic points from the stress relaxation test curve;

choosing second predetermined variables, making an initial range for the second predetermined variables, and checking lower and upper bounds for the second predetermined variables using the computer;

evaluating a stress of the material against test stress of the material using the computer;

determining whether a stress error of the material is less than a second predetermined tolerance using the computer;

outputting the second predetermined variables if the stress error is less than the second predetermined tolerance using the computer;

making multiple trial vectors if the stress error is not less than the second predetermined tolerance using the computer;

making a material card for the material of the crash test dummy component from the outputted second predetermined variables using the computer;

providing a finite element model for the crash test dummy component suing using the computer;

applying the material card in the finite element model to validate the finite element model using the computer;

determining whether the finite element model is acceptable;

ending the method if the finite element model is acceptable; and adjusting the material card to make the material soft or stiff if the finite element model is not acceptable.

\* \* \* \* \*

UNITED STATES PATENT AND TRADEMARK OFFICE
CERTIFICATE OF CORRECTION

PATENT NO.         : 9,043,187 B2                                    Page 1 of 1
APPLICATION NO.    : 13/333313
DATED              : May 26, 2015
INVENTOR(S)        : Hyunsok Pang It is certified that error appears in the above-identified patent and that said Letters Patent is hereby corrected as shown below:

Claims

Column 8 Line 31 Claim 14: delete "component suing using the computer;" and insert therefor --component using the computer;--

Signed and Sealed this
Fifth Day of January, 2016

Michelle K. Lee
*Director of the United States Patent and Trademark Office*